United States Patent
Heimlicher

(10) Patent No.: US 7,330,668 B2
(45) Date of Patent: Feb. 12, 2008

(54) LOW NOISE LIGHT RECEIVER

(75) Inventor: Peter Heimlicher, Fribourg (CH)

(73) Assignee: Optosys S.A. (CH)

( * ) Notice: Subject to any disclaimer, the term of this patent is extended or adjusted under 35 U.S.C. 154(b) by 654 days.

(21) Appl. No.: 10/815,441

(22) Filed: Apr. 1, 2004

(65) Prior Publication Data

US 2004/0211886 A1 Oct. 28, 2004

(30) Foreign Application Priority Data

Apr. 1, 2003 (EP) ................................. 03405218

(51) Int. Cl.
*H04B 10/06* (2006.01)

(52) U.S. Cl. .................... 398/202; 398/208; 398/209; 398/210; 398/214; 398/136; 398/137; 398/141; 250/214 A; 250/214 LA; 250/214 R; 250/214 AG; 250/222.1; 250/221; 330/59; 330/308

(58) Field of Classification Search ................ 398/202, 398/208, 141, 209, 210, 214, 137, 136; 250/214 A, 250/214 R, 214 LA, 214 AR, 222.1, 221, 250/224 AG; 330/308, 59

See application file for complete search history.

(56) References Cited

U.S. PATENT DOCUMENTS

| | | | |
|---|---|---|---|
| 3,928,760 A * | 12/1975 | Isoda ........................ 398/131 |
| 5,243,182 A * | 9/1993 | Murata et al. ............ 250/222.1 |
| 5,339,019 A | 8/1994 | Benz ........................ 323/286 |
| 5,714,909 A | 2/1998 | Jackson ..................... 330/308 |
| 5,734,300 A | 3/1998 | Yoder ......................... 330/308 |
| 5,787,215 A * | 7/1998 | Kuhara et al. ............... 385/88 |
| 5,923,454 A * | 7/1999 | Eastmond et al. ......... 398/202 |
| 6,084,232 A | 7/2000 | Kimura ...................... 250/214 |
| 6,329,881 B1 | 12/2001 | Tachigori .................... 330/308 |
| 6,469,489 B1 | 10/2002 | Bourquin et al. ............ 324/96 |

FOREIGN PATENT DOCUMENTS

| EP | 0100387 | 2/1984 |
|---|---|---|
| EP | 07208918 | 8/1995 |
| EP | 2000214501 | 8/2000 |

OTHER PUBLICATIONS

European Search Report, Sep. 2003.
Titlepage to *Photodiode Amplifiers* by Jerald G. Graeme, 1996.

* cited by examiner

*Primary Examiner*—Hanh Phan
(74) *Attorney, Agent, or Firm*—Ostrolenk, Faber, Gerb & Soffen, LLP

(57) ABSTRACT

The low noise light receiver comprises a light sensor for generating a sensor signal, the sensor signal comprising a wanted signal resulting from a light source and an interfering signal resulting from interfering light; an optical filter apparatus for reducing the interfering light; an electric filter apparatus connected to the light sensor for filtering out the interfering signal and for generating a correction signal that substantially compensates for the interfering signal; and a processing apparatus connected to the light sensor and the electric filter apparatus for processing the wanted signal in order to generate an output signal ($V_{out}$).

11 Claims, 3 Drawing Sheets

LOW NOISE LIGHT RECEIVER

FIELD OF THE INVENTION

The invention refers to a low noise light receiver comprising a light sensor and processing means for generating an output signal.

BACKGROUND OF THE INVENTION

In the conversion of light into electric current for the purpose of signal transmission, the requirements may vary and numerous realizations are possible. However, in almost every case, the conversion at a given signal bandwidth and intensity of the received light should be as noiseless as possible.

A component that is very frequently used for the conversion of light signals into electric signals is the photodiode. In many cases, it is superior to other converters. Since the electric signal delivered by a photodiode is normally very weak, it must be amplified by means of an amplifier in order to be utilized. At a given bandwidth and intensity of the received light, the photodiode and the amplifier largely determine the signal to noise ratio of the signal available at the output of the amplifier. Among the literature relating to the corresponding prior art, the book "Photodiode Amplifiers" by Jerald G. Graeme, McGraw-Hill, New York, 1996 may e.g. be cited.

A commonly used arrangement is shown in FIG. 1 and is discussed below.

U.S. Pat. No. 5,714,909 describes an amplifier with a feedback loop to provide a feedback current signal to cancel ambient noise in the current signal in the input node.

U.S. Pat. No. B1-6,329,881 describes a preamplifier with a feedback circuit including an average detecting circuit for detecting an average output voltage of the current feedback circuit and a current controlling circuit for distributing the input optical current in accordance with the detected average voltage.

U.S. Pat. No. B1-6,469,489 describes an electrical circuit with feedback means and a voltage-controlled current source.

U.S. Pat. No. 5,734,300 describes a control circuit for shunting DC and AC components of the signal from an electro-optical device away from a preamplifier input.

All the electrical circuits described in the US-patents mentioned above have the disadvantage that intense ambient light may cause a large shot noise resulting in a relatively poor signal to noise ratio.

SUMMARY OF THE INVENTION

Based on this prior art, it is an object of the present invention to provide a light receiver that remains operational even in conditions of intense ambient light but offers an improved signal to noise ratio.

This is accomplished by a light receiver as described below. The light receiver is a low noise light receiver which has a light sensor for generating a sensor signal. The sensor signal has a wanted signal resulting from a light source and an interfering signal resulting from interfering light. An optical filter reduces the interfering light. An electric filter is connected to the light sensor for filtering out the interfering signal and for generating a correction signal that substantially compensates the interfering signal. A processor or processing means connected to the light sensor and the electric filter processes the wanted signal in order to generate an output signal.

The light receiver of the invention has the advantage that it is applicable also in conditions of intense ambient light and provides an improved signal to noise ratio.

Other features and advantages of the present invention will become apparent from the following description of the invention which refers to the accompanying drawings.

BRIEF DESCRIPTION OF THE DRAWINGS

The invention will be explained hereinafter by means of a preferred exemplary embodiment and with reference to figures, where.

DESCRIPTION OF A PRIOR ART EMBODIMENT

Figure 1:
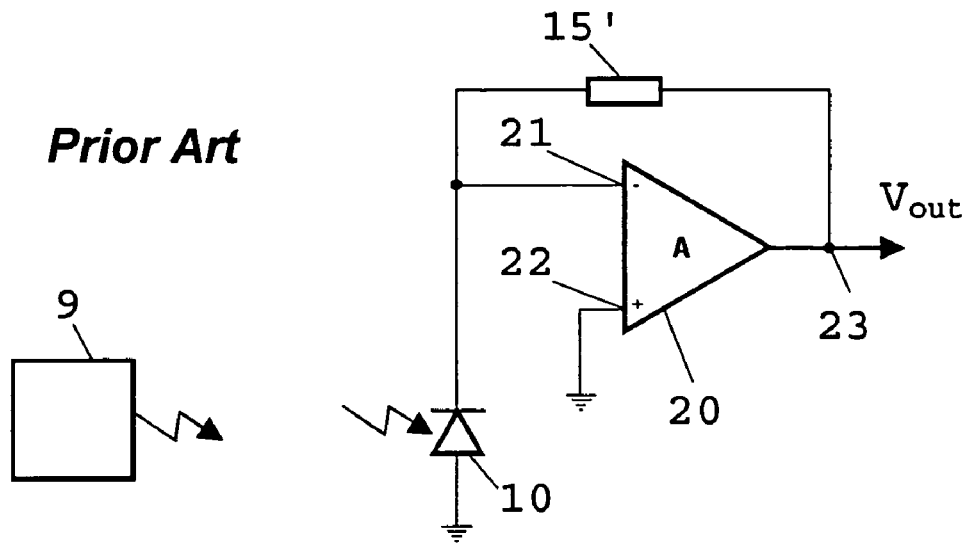
FIG. 1 shows a light receiver of the prior art.

FIG. 1 shows a commonly used arrangement of photodiode 10 and amplifier 20. Photodiode 10 is connected to the inverting input 21 of amplifier 20 and via load resistor 15' to output 23 of amplifier 20. The voltage $V_{out}$ measured at output 23 is essentially proportional to the current generated by photodiode 10 when it receives the light signals emitted by a light source 9. Thus, the assembly of FIG. 1 acts as a current-voltage converter.

The principal noise sources of the assembly according to FIG. 1 are photodiode 10 and load resistor 15'. On the other hand, the noise produced by amplifier 20 is negligible in the intense ambient light that may be present in sensory applications. Due to thermal noise, load resistor 15' produces a noise current that represents the major part of the overall noise. Now, a fundamental disadvantage of the assembly according to FIG. 1 is that load resistor 15' must be dimensioned such that a saturation of amplifier 20 is excluded even if intense ambient light (e.g. 100,000 Lux in the midday sun) is superimposed on light source 9. A saturation of amplifier 20 is prevented by selecting a relatively small load resistance of resistor 15'. In the case of a photodiode having a chip surface area of 1 mm², for example, this resistance is approximately equal to $R_f$=22 kOhm. However, a small resistance $R_f$ necessarily leads to a relatively high value of the thermal noise current generated by resistor 15'. This is illustrated by formula 1, according to which $$i_{nt} = \sqrt{\frac{4kT\Delta f}{R_f}} \qquad \text{(formula 1)}$$

where
$i_{nt}$=thermal noise current [A]
k=Boltzmann's constant, 1.38×10⁻²³ JK⁻¹

T=temperature in Kelvin [K]
Δf=noise bandwidth [Hertz]
R$_f$=load resistance [Ohm]

However, an excessive noise of the light receiver is disadvantageous as it results in a correspondingly poor signal to noise ratio.

DESCRIPTION OF A PREFERRED EMBODIMENT OF THE INVENTION

Figure 2:
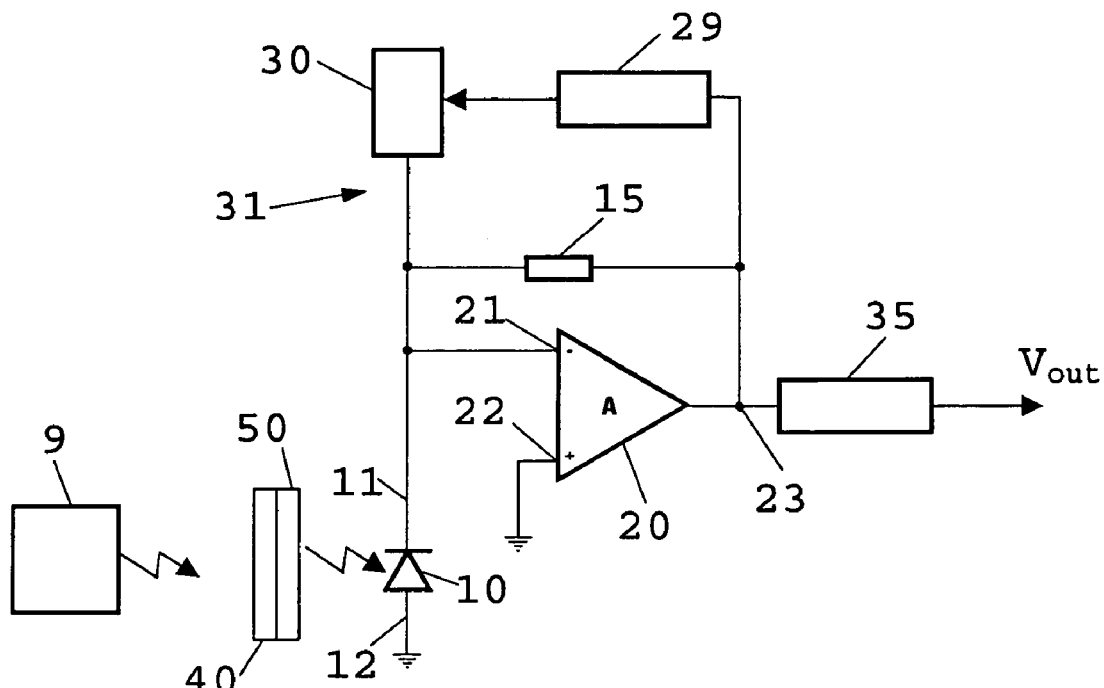
FIG. 2 shows a light receiver according to the invention.

The light receiver shown in FIG. 2 comprises a light sensor, which may e.g. be a photodiode 10 of the conventional type, as well as an amplifier 20, which may be in the form of an operational amplifier. Cathode 11 of photodiode 10 is connected to inverting input 21 of amplifier 20, while anode 12 of photodiode 10 and the non-inverting input 22 of amplifier 20 are connected to ground. Photodiode 10 of FIG. 2 is operated in the photovoltaic mode, i.e. no external voltage is applied to photodiode 10. However, it is also possible to operate photodiode 10 in the non-conducting direction (photoconductive mode).

Output 23 of amplifier 20 is connected to a resistor 15 which in turn is connected to the inverting input 21 of amplifier 20, thereby allowing a feedback of the output signal of amplifier 20.

Amplifier 20 and resistor 15 form part of the processing means for processing the signal produced by light sensor 10. The processing means 15, 20 is adapted to receive the sensor signal and to produce an amplified output signal at output 23.

Furthermore, it appears in FIG. 2 that additional electric filter means 29 and 30 are provided which are connected in parallel to resistor 15. To this end, filter means 29 and 30 are connected to output 23 of amplifier 20 and to its inverting input 21, thereby forming a negative feedback path 31. They comprise a low pass filter 29 and a current sink 30 connected thereto, e.g. in the form of a current controlled or voltage controlled current source. Current sink 30 forms the control element of a regulating system, the regulation being accomplished by negative feedback in case of the assembly of FIG. 2. Current sink 30 and low-pass filter 29 are known to those skilled in the art and will therefore not be described in more detail.

When receiving light signals of an effective light source 9 such as a light emitting diode, photodiode 10 generates a photocurrent representing the wanted signal. The light signals are emitted in the form of light pulses of a certain pulse frequency Fp, such that the wanted signal will also exhibit the frequency Fp.

Now, if an interference light source is present for instance natural and/or artificial ambient light, photodiode 10 will generate an additional, unwanted photocurrent representing an interfering signal that is superimposed on the wanted signal.

The frequency Fp is chosen such that the frequency range of the ambient light is substantially lower. Typically, Fp=15 kHz. On the other hand, usual lamps e.g. have a modulation frequency of 100 Hz. Based on this realization, the photocurrent which is generated by photodiode 10 can be divided into a component corresponding to the wanted signal and a component corresponding to the interfering signal, which allows these two components to be processed separately. To this end, the electric filter means 29 and 30 of the light receiver are dimensioned according to the frequency Fp. Thus, the cutoff frequency of low pass filter 29 is selected smaller than the frequency Fp, such that the wanted signal is fed back in a negligible way and consequently current sink 30 essentially receives the interfering signal. Current sink 30 in turn is regulated by the negative feedback in such a manner as to generate a current serving as a correction signal which essentially compensates the interfering signal fed back.

Negative feedback path 31 acts as a frequency crossover that separates the interfering signal and the wanted signal. Since the photocurrent flowing through resistor 15 corresponds essentially to the wanted signal, the resistor 15 need only be designed for the maximally processed amplitude of the wanted signal. This is in contrast to the assembly according to FIG. 1 where the resistor 15' must be designed for the sum of the interfering signal and of the wanted signal in order to prevent a saturation of the amplifier. Thus, a substantially higher value for the resistance of resistor 15 may be selected (typically approx. R$_f$=1 MOhm), so that, according to formula 1, a much lower noise will be generated.

Although filter means 29, 30 represent additional unwanted noise sources, the resulting additional noise is negligible as compared to the reduction provided by the application of a higher-ohmic resistor 15. The major part of the noise generated by current sink 30 is shot noise (irregular current variations resulting from the fact that the charge transport is accomplished by the movement of discrete charge carriers). As explained in more detail below with reference to formula 2, the shot noise is essentially proportional to the root of the current flowing. As the current generated by current sink 30 is essentially equal to the photocurrent, the resulting increase in overall noise is only $2^{1/2} \approx 1.41$. According to the above example, however, the noise reduction resulting from the application of a higher resistance is substantially greater: (1 MOhm/22 kOhm)$^{1/2} \approx 6.75$. The noise of low pass filter 29 is negligible as it is designed for a low and therefore irrelevant frequency range.

The application of filter means 29 and 30 according to FIG. 2 allows to separate the wanted signal from the interfering signal, so that signal processing means 15, 20 may substantially process the wanted signal only, whereas the interfering signal is diverted to current sink 30. This allows a noise reduction of the light receiver while simultaneously preventing a saturation of amplifier 20 by ambient light.

Optionally, the light receiver illustrated in FIG. 2 further comprises an electric band pass filter 35 of a known type that is connected in series with the output 23 of the amplifier 20. Band pass filter 35 is designed to let the wanted signal pass substantially unaffected whereas the unwanted components of the spectrum are filtered out for noise reduction. The result is a further improved signal to noise ratio.

Even in conditions of intense ambient light, the feedback circuit 31 prevents a saturation of the amplifier 20. However, the photodiode 10 may generate such a high photocurrent that the resulting shot noise may no longer be negligible under certain circumstances. The shot noise corresponds to $$i_{ns} = \sqrt{2q(I_d + I_{ph})\Delta f} \qquad \text{(formula 2)}$$

where
$i_{ns}$=shot noise current [A]
q=electron charge, $1.6 \times 10^{-19}$ Coulomb
$I_d$=dark current [A]
$I_{ph}$=photocurrent [A]
Δf=noise bandwidth [Hertz]

Mainly for the suppression of this shot noise, optical filter means 40 and 50 are provided allowing to attenuate the ambient light impinging on photodiode 10, such that the photocurrent $I_{ph}$ and with it the shot noise current $i_{ns}$ is substantially reduced. The optical filter means 40 and 50 are designed in accordance with the wavelength $\lambda_0$ of the light signal emitted by light emitting diode 9 (e.g. $\lambda_0$=0.680 µm) and comprise a first filter 40 and preferably a second filter 50.

Figure 4:
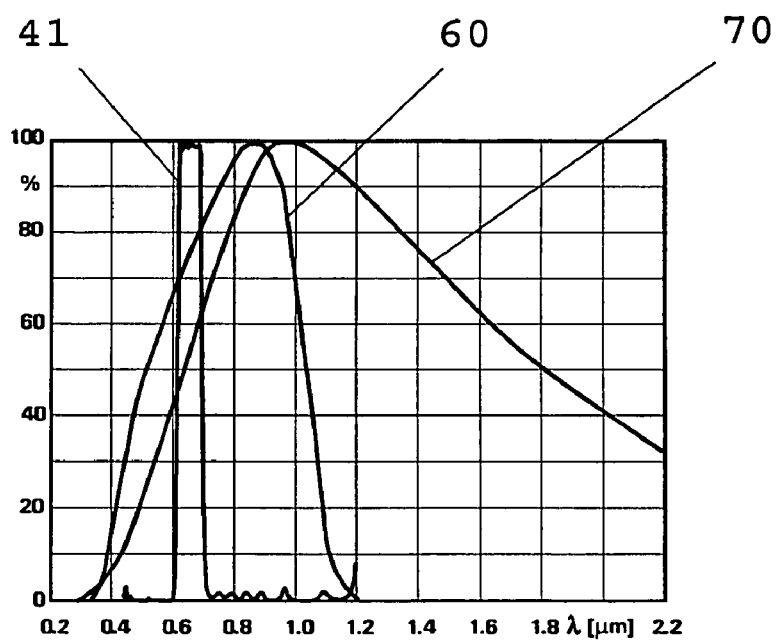
FIG. 4 shows the transmission curve 41 of a dielectric optical filter as well as the two curves 60 and 70 of FIG. 2.

The first filter 40 is a dielectric band pass filter (interference filter comprising a certain number of thin dielectric layers). Curve 41 in FIG. 4 shows the transmission behavior of a suitable band pass filter 40 in function of the wavelength $\lambda$ of the impinging light (transmission curve). The transmission band is adjusted to the wavelength $\lambda_0$ of effective light source 9 and is relatively narrow, and the edges of curve 41 are steep.

The characteristics of band pass filter 40 are specified for a certain wavelength range ("near range"). The upper and lower limits of this wavelength range will be designated by $\lambda_1$ resp. $\lambda_2$ herebelow. Inter alia, the width of wavelength range $\lambda_2-\lambda_1$ is determined by the number of optical layers used. In the band pass filter 40 whose transmission curve 41 is shown in FIG. 4, approx. 60 optical layers are used so that $\lambda_1$ is approx. 0.4 µm and $\lambda_2$ is approx. 1.2 µm.

Outside the specified wavelength range ($\lambda<\lambda_1$ resp. $\lambda>\lambda_2$, "far range"), however, a dielectric band pass filter exhibits a poor blocking behavior. The production of a band pass filter having a very wide wavelength range is complicated and expensive due to the large number of optical layers required.

Figure 3:
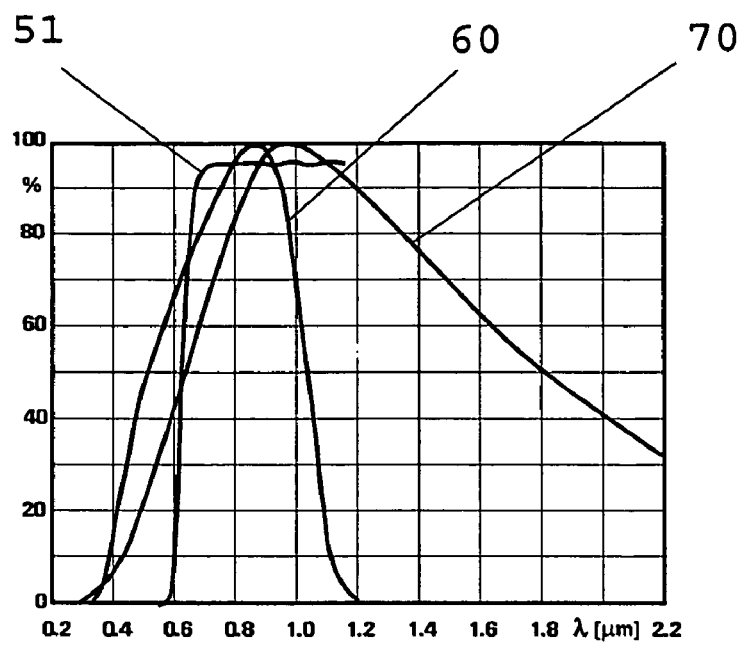
FIG. 3 shows the transmission curve 51 of a color filter, the spectral sensitivity 60 of a typical silicon photodiode, as well as the spectral energy distribution 70 of sunlight.

In addition, to ensure a good blocking behavior for wavelengths below $\lambda_1$, a second filter 50 is disposed after band pass filter 40. Second filter 50 is a color filter and is produced e.g. by tinting a synthetic material or glass. Curve 51 in FIG. 3 shows the transmission behavior of a suitable color filter 50. The latter absorbs light of a wavelength smaller than $\lambda_0$ and particularly smaller than $\lambda_1$ while it is nearly transmissive for light of a wavelength greater than $\lambda_0$. Consequently, it acts like an cutoff filter.

As the usual photodiodes are hardly sensitive to large wavelengths, a poor blocking behavior of band pass filter 40 in the range $\lambda>\lambda_2$ is quite irrelevant. FIG. 4 shows the spectral sensitivity 60 of a typical silicon photodiode (normalized with the maximum value).

The sensitivity is almost zero for wavelengths greater than $\lambda_2$. However, it is possible to use additional color filters to improve the blocking behavior of band pass filter 40 for larger wavelengths. Furthermore, for comparison, the spectral energy distribution 70 of sunlight is also shown in FIG. 4 (normalized with the maximum value).

Figure 5:
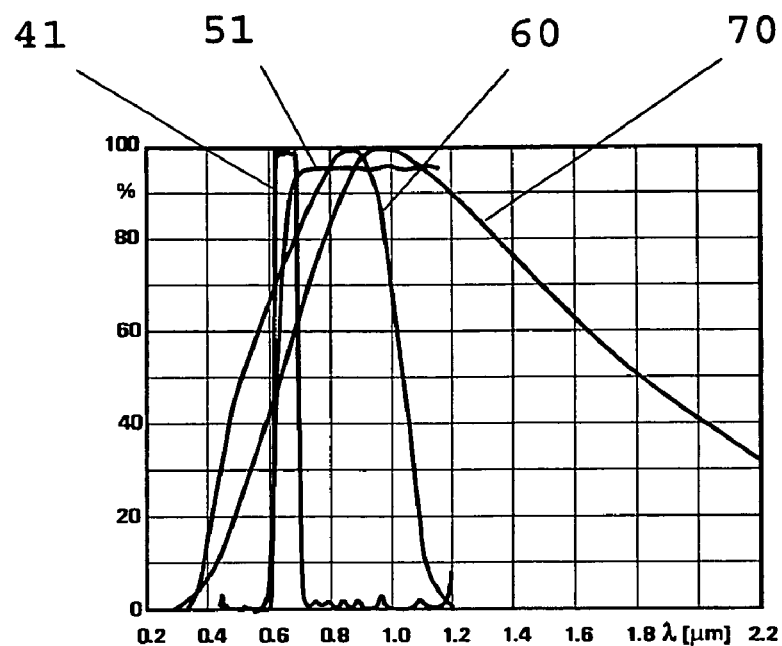
FIG. 5 shows a superposition of FIGS. 3 and 4.

The successive arrangement of a dielectric band pass filter 40 having the characteristics of curve 41 and of a color filter 50 having the characteristics of curve 51 results in a narrow-band optical filter having very steep slopes and simultaneously very good blocking properties in the far range. As appears in FIG. 5, the slope of the color filter is located at the short-wave end of the transmission band of band pass filter 41. The application of optical filter means 40 and 50 allows to effectively eliminate a large fraction of the ambient light in the sensitive range of photodiode 10 and thus provides considerable reduction particularly of the shot noise of photodiode 10.

Figure 6:
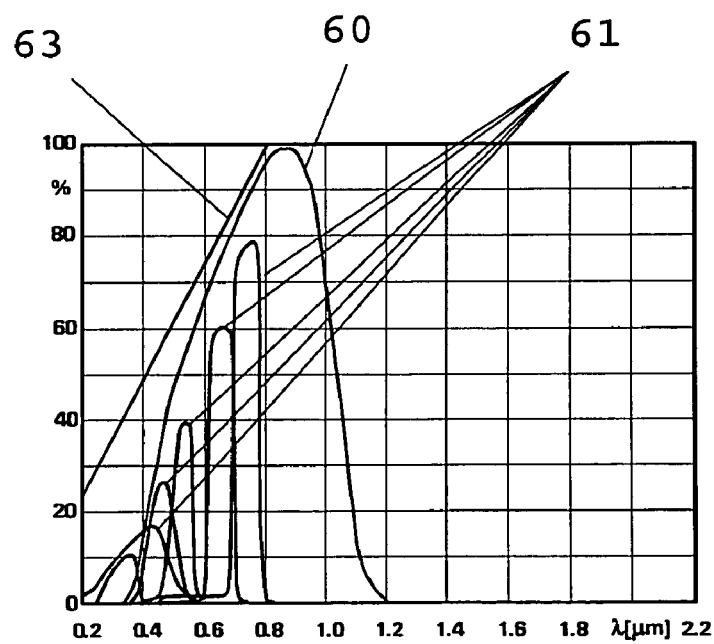
FIG. 6 shows the spectral sensitivity 61 of different wavelength-selective photodiodes, curve 60 of FIG. 3, as well as the theoretically attainable limit 63 of the spectral sensitivity.

An additional optical filtering may be achieved through the application of wavelength-selective photodiodes. The latter are only sensitive within a narrow wavelength range around $\lambda_0$. FIG. 6 shows the transmission curves 61 of six different types of such wavelength-selective photodiodes. The filter effect is determined by the choice and the dotation of the semiconductor material of the photodiode. For comparison, the sensitivity curve 60 of a silicon photodiode according to FIG. 3 and the theoretically possible limit 63 are shown.

The application of the electric and optical filter means described here leads to a substantial reduction of the noise even in intense wide-band ambient light. In particular, usage of the feedback circuit 31 together with the high-ohmic resistor 15 allows a substantial reduction of the thermal noise without risk of a saturation of the amplifier 20, whereas the shot noise produced by the light sensor 10 can be substantially reduced by means of the optical filter means 40, 50. Depending on the kind and the intensity of the ambient light, an improvement of the signal to noise ratio in the range of 15 to 20 dB is achieved. This allows a larger working distance between the light receiver and the effective light source and/or a larger bandwidth of the wanted signal.

Amongst other applications, light receivers are used in photoelectric proximity switches serving as sensors for detecting the presence of an object in a monitored area e.g. in the fields of manufacture, handling, and storage. The application of the light receiver according to the invention allows a substantial increase of the performance of such a proximity switch.

Various modifications are apparent to those skilled in the art from the above disclosure without leaving the protective scope of the invention as defined by the claims.

The measures for noise reduction described here are not primarily determined by the kind and operation of the applied light sensor. Thus, for example, a substantial noise reduction is also achieved in the case of a photodiode 10 operated with a bias voltage in the non-conduction direction (photoconductive mode).

Furthermore, instead of the low pass filter, it is possible to use an electric band rejection filter for filtering out the wanted signal in the negative feedback path. In this case, however, additional electric components are required to ensure a negative feedback which is stable. Furthermore, the application of digital filters is also possible.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. Low noise light receiver, comprising
    a light sensor for generating a sensor signal, the sensor signal comprising a wanted signal resulting from a light source and an interfering signal resulting from interfering light;
    an optical filter for the light sensor for reducing the interfering light;
    an electric filter connected to the light sensor for filtering out the interfering signal and for generating a correction signal that substantially compensates for the interfering signal; and
    a processor connected to the light sensor and the electric filter for processing the wanted signal in order to generate an output signal, the processor comprising an amplifier and a feedback resistor, a photocurrent, corresponding essentially to the wanted signal, flowing through the feedback resistor, the resistance of the feedback resistor being selected to prevent a saturation of the amplifier, and being higher than the resistance of the feedback resistor, selected to prevent a saturation of the amplifier, in the event that a photocurrent, corresponding to the wanted signal and the interfering signal, flows through the feedback resistor, the higher resistance of the feedback resistor lowering the noise produced by the feedback resistor when compared to the noise produced by the feedback resistor, in the event that the photocurrent, corresponding to the wanted signal and the interfering signal, flows through the feedback resistor.

2. Light receiver according to claim 1, wherein the optical filter comprises an optical band pass filter.

3. Light receiver according to claim 2, wherein the optical band pass filter is a dielectric filter.

4. Light receiver according to claim 1, wherein the optical filter comprises at least one optical cutoff filter.

5. Light receiver according to claim 4, wherein the optical filter further comprises an optical band pass filter and the slope of the optical cutoff filter is at the short-wave end of the transmission range of the optical band pass filter.

6. Light receiver according to claim 4, wherein the optical cutoff filter is a color filter.

7. Light receiver according to claim 1, wherein the light sensor is a wavelength-selective photodiode.

8. Light receiver according to claim 1, wherein the electric filter comprises a current sink and a low pass filter.

9. Light receiver according to claim 8, wherein the current sink is adjustable for essentially compensating for the interfering signal.

10. Light receiver according to claim 1, wherein the electric filter is connected in parallel to the processor.

11. Photoelectric proximity switch including a light receiver according to claim 1.

* * * * *